US012563850B2

(12) United States Patent
Lin et al.

(10) Patent No.: US 12,563,850 B2
(45) Date of Patent: Feb. 24, 2026

(54) OPTICAL PACKAGE STRUCTURE

(71) Applicant: TONG HSING ELECTRONIC INDUSTRIES, LTD., Taipei City (TW)

(72) Inventors: Chien-Hung Lin, Taipei City (TW); Bae-Yinn Hwang, Taipei City (TW); Wen-Fu Yu, Taipei City (TW); Wei-Li Wang, Taipei City (TW)

(73) Assignee: TONG HSING ELECTRONIC INDUSTRIES, LTD., Taipei City (TW)

( * ) Notice: Subject to any disclaimer, the term of this patent is extended or adjusted under 35 U.S.C. 154(b) by 444 days.

(21) Appl. No.: 18/460,576

(22) Filed: Sep. 3, 2023

(65) Prior Publication Data

US 2024/0204019 A1     Jun. 20, 2024

(30) Foreign Application Priority Data

Dec. 15, 2022     (TW) .................................. 111148181
Jun. 7, 2023     (TW) ................................. 112121145

(51) Int. Cl.
H10F 39/00          (2025.01)
H10H 20/84          (2025.01)

(52) U.S. Cl.
CPC ......... H10F 39/8057 (2025.01); H10H 20/84 (2025.01)

(58) Field of Classification Search
CPC ... H10F 39/8057; H10F 39/806; H10H 20/84; H01L 27/14623; H01L 33/44; H01L 31/02164
See application file for complete search history.

(56) References Cited

U.S. PATENT DOCUMENTS 5,753,857 A  *   5/1998   Choi ..................... H10F 39/011
                                                       257/E31.118
7,936,062 B2      5/2011   Humpston et al.
8,269,300 B2 *    9/2012   Chien ................... H10F 39/804
                                                       257/434
11,257,964 B2     2/2022   Liu et al.
11,309,275 B2 *   4/2022   Hsin ....................... H01L 24/48
11,411,029 B2     8/2022   Chang
                        (Continued)

*Primary Examiner* — Earl N Taylor

(74) *Attorney, Agent, or Firm* — Li & Cai Intellectual Property Office

(57)          ABSTRACT

An optical package structure includes a light transmittable member, a bonding structural member, and an optical element. The bonding structural member includes a first bonding layer and a second bonding layer to form a light-scattering structure. The first bonding layer is connected to a bonding surface of the light transmittable member. An inner side of the first bonding layer includes a plurality of first protruded portions. An inner side of the second bonding layer includes a plurality of second protruded portions. The second protruded portions and the first protruded portions are arranged in a staggered manner. The bonding structural member includes the first bonding layer or the light-absorption member. The light-absorption member is filled in con-caved portions of the first bonding layer. The optical element is connected to the bonding structural member, and is spaced apart from the light transmittable member.

15 Claims, 13 Drawing Sheets

(56) References Cited

U.S. PATENT DOCUMENTS

| | | | |
|---|---|---|---|
| 11,764,240 B2* | 9/2023 | Chang | H10F 39/028 |
| | | | 257/434 |
| 2007/0181792 A1* | 8/2007 | Yoshimoto | H10F 39/011 |
| | | | 250/239 |
| 2015/0364516 A1* | 12/2015 | Chen | H10F 39/802 |
| | | | 257/443 |
| 2017/0133520 A1* | 5/2017 | Saxod | H01L 24/32 |
| 2018/0090524 A1* | 3/2018 | Wang | H10F 39/12 |
| 2021/0057470 A1* | 2/2021 | Hung | H10F 39/804 |
| 2023/0207590 A1* | 6/2023 | Chang | H10F 39/811 |
| | | | 257/432 |
| 2023/0215896 A1* | 7/2023 | Lee | H10F 39/811 |
| | | | 257/666 |
| 2023/0230939 A1* | 7/2023 | Lee | H01L 23/552 |
| | | | 257/659 |
| 2024/0321810 A1* | 9/2024 | Tseng | H01L 24/32 |
| 2024/0395950 A1* | 11/2024 | Hsu | H01L 23/3128 |

* cited by examiner

OPTICAL PACKAGE STRUCTURE

CROSS-REFERENCE TO RELATED PATENT APPLICATION

This application claims the benefit of priorities to Taiwan Patent Application No. 112121145, filed on Jun. 7, 2023, and Ser. No. 11/148,181, filed on Dec. 15, 2022. The entire content of each of the above identified applications is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an optical package structure, and more particularly to an optical package structure capable of effectively reducing a flare.

BACKGROUND OF THE DISCLOSURE

A conventional optical package structure includes an optical element, a bonding layer, and a light transmittable layer. The optical element can be, for example, an image sensor or a display element. Taking a chip of the image sensor for example, the chip has a chip substrate and an image-sensing region. The image-sensing region is an optical function region of photosensitivity. The bonding layer is connected to the chip substrate and surrounds the image-sensing region in an annular manner. The light transmittable layer is disposed above the image-sensing region through the bonding layer, and allows external light to enter the image-sensing region of the chip for image sensing. However, when the light passes through the light transmittable layer at certain angles, a light reflection phenomenon may occur due to changes of a refractive index. If the light is reflected to the image-sensing region, a flare will be formed, and the accuracy of the image sensing is affected.

In addition, the display element (e.g., a micro display) has a light outputting region, or referred to as a display emitting region. The light outputting region is an optical function region for emitting light, such as a light emitting diode (LED), an organic light emitting diode (OLED), or a backlight. The emitted light may be partially refracted or reflected by a region outside of the optical function region, such as a packaging material or the bonding layer. When such light enters the human eye, people may feel a flare or a light spot outside of the optical function region. Therefore, the conventional optical package structure still has room for improvement.

SUMMARY OF THE DISCLOSURE

In response to the above-referenced technical inadequacies, the present disclosure provides an optical package structure to reduce the occurrence of a flare.

In order to solve the above-mentioned problems, one of the technical aspects adopted by the present disclosure is to provide an optical package structure, which includes a light transmittable member, a first bonding layer, a second bonding layer, and an optical element. The light transmittable member has a bonding surface. The first bonding layer has an enclosed shape, and is connected to the bonding surface of the light transmittable member. The first bonding layer is made of opaque material. The first bonding layer includes a first inner circumference and a plurality of first protruded portions. The first protruded portions protrude inwardly from the first inner circumference. The second bonding layer has an enclosed shape. The second bonding layer is opposite to the light transmittable member and is connected to the first bonding layer. The second bonding layer is made of an opaque material. The second bonding layer includes a second inner circumference and a plurality of second protruded portions. The second protruded portions protrude inwardly from the second inner circumference. The second protruded portions and the first protruded portions are arranged in a staggered manner. The optical element is connected to the second bonding layer. The optical element and the light transmittable member are spaced apart from each other.

In order to solve the above-mentioned problems, another one of the technical aspects adopted by the present disclosure is to provide an optical package structure, which includes a light transmittable member, a first bonding layer, a light-absorption member, and an optical element. The light transmittable member has a bonding surface. The first bonding layer has an enclosed shape, and is connected to the bonding surface of the light transmittable member. The first bonding layer is made of an opaque material. The first bonding layer includes a first inner circumference, a plurality of first protruded portions, and a plurality of first concave portions. The plurality of first protruded portions protrude inwardly from the first inner circumference. Each of the first concave portions is arranged between two adjacent ones of the first protruded portions. The light-absorption member is disposed on the first inner circumference of the first bonding layer. The light-absorption member is filled in some or all of the first concave portions. The optical element is connected to the first bonding layer. The optical element and the light transmittable member are spaced apart from each other.

Therefore, in the optical package structure provided by the present disclosure, the first protruded portions of the first bonding layer and the second protruded portions of the second bonding layer are arranged in a staggered manner and form a protrusion structure, so that light reflected to an optical function region of the optical package structure can be reduced, or the light from the optical function region is less likely to be refracted or reflected by a non-display region (such as a package material or a bonding layer). In this way, the occurrence of a flare is reduced. In another embodiment, the optical package structure of present disclosure includes the light-absorption member. The light-absorption member is disposed on the first inner circumference of the first bonding layer. The light-absorption member can absorb light, so that the light reflected to the optical function region of the optical package structure is reduced, or the light from the optical function region is less likely to be refracted or reflected by the non-display region (such as a package material or a bonding layer). Accordingly, the occurrence of a flare is reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
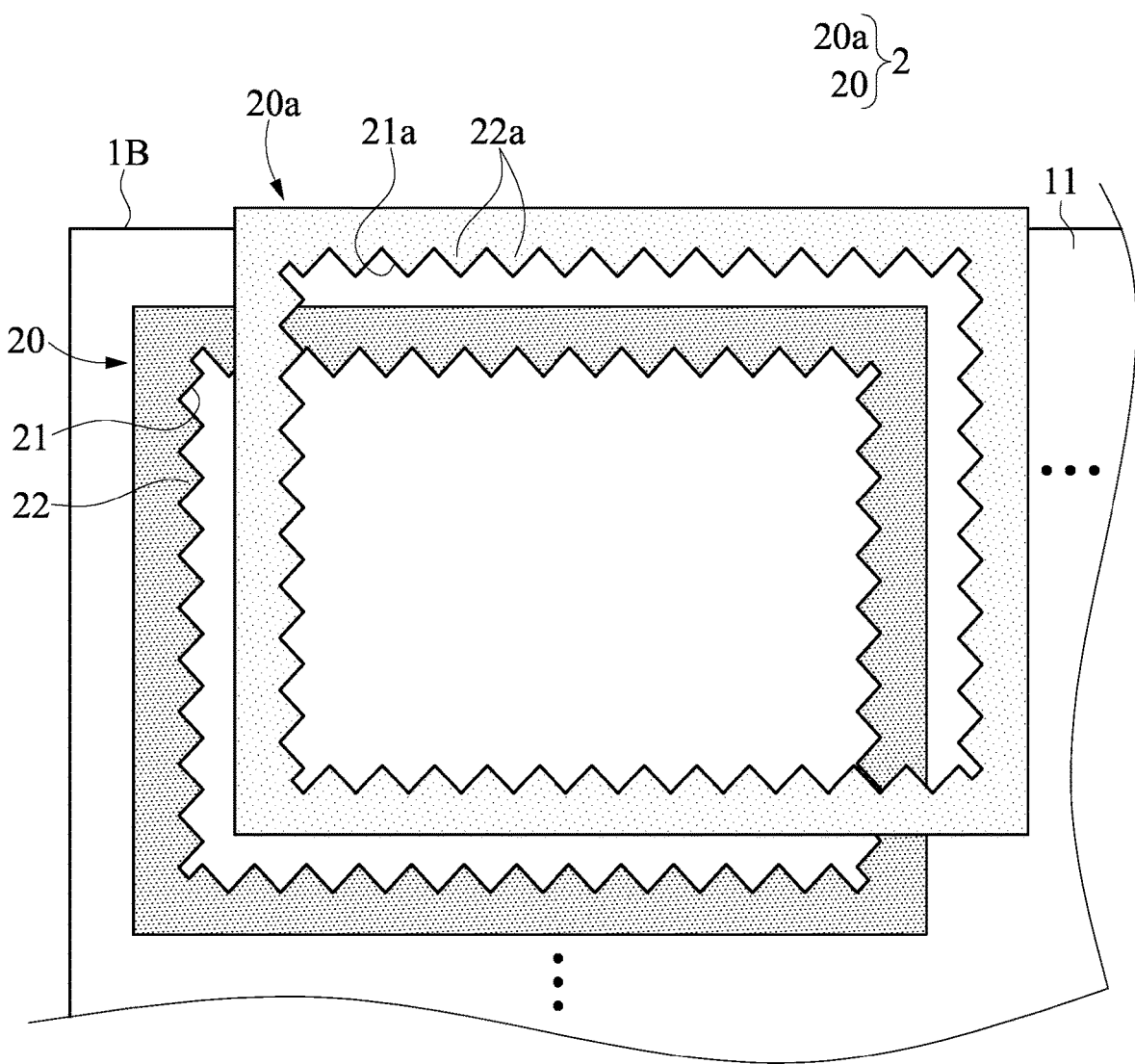
FIG. 1 is a schematic exploded view of a bonding structural member according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way.

Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 4, a first embodiment of the present disclosure provides an optical package structure, which can be applied to an optical element (such as an image sensor or a display element). The optical package structure is suitable for being mounted on a circuit board (not shown).

Figure 2:
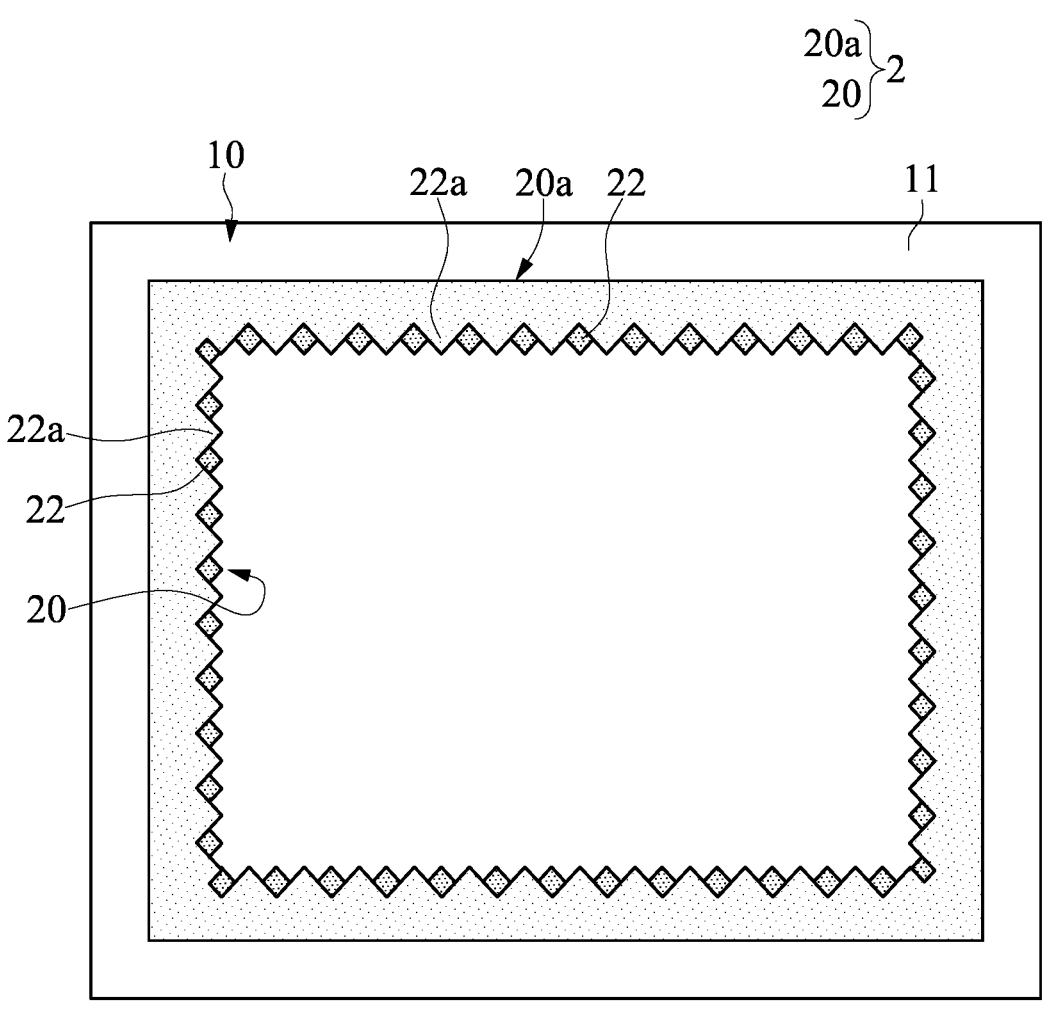
FIG. 2 is a schematic top view of the bonding structural member according to the first embodiment of the present disclosure.
Figure 3:
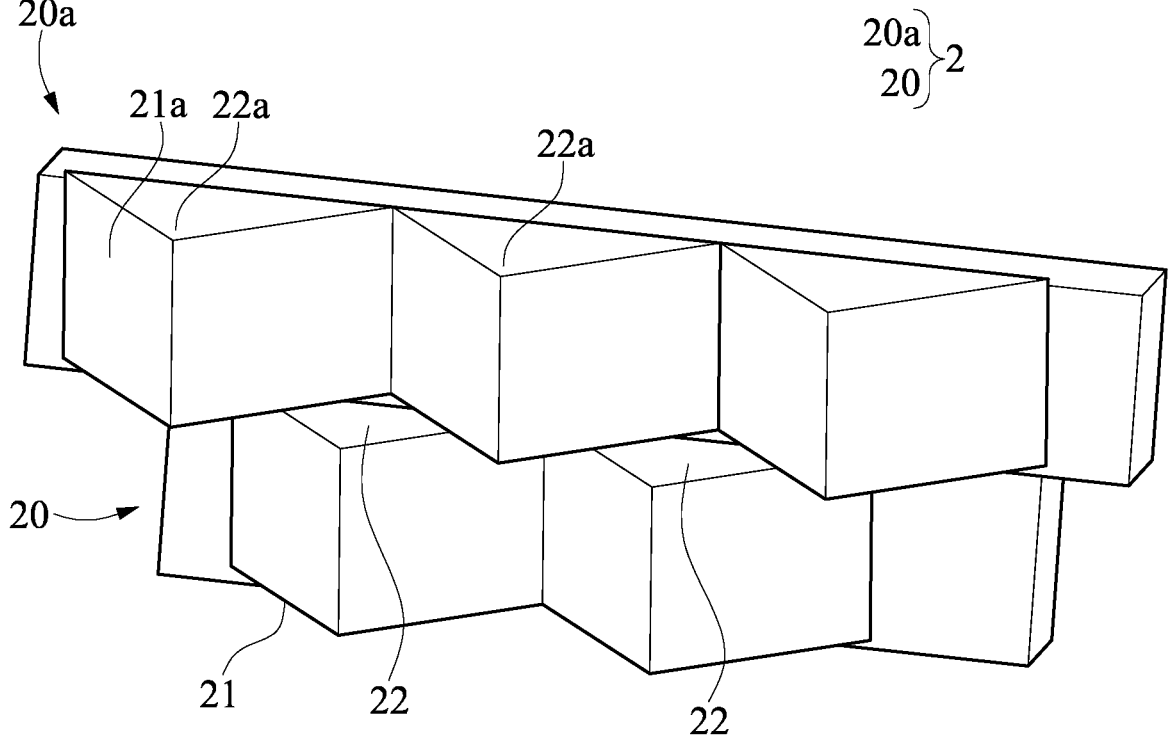
FIG. 3 is a schematic perspective view of the bonding structural member according to the first embodiment of the present disclosure.

Referring to FIG. 1, the main characteristic of the optical package structure of the present disclosure is that a bonding structural member 2 has two layers that are stacked up and down, which are a first bonding layer 20 and a second bonding layer 20*a*. Each bonding layer has a protrusion structure (22, 22*a*). As shown in FIG. 2 and FIG. 3, after the bonding structural member 2 is completed, the protrusion structures (22, 22*a*) of the stacked layers are arranged in a staggered manner, so as to form a light scattering structure. Therefore, light reflected on an optical function region of the optical package structure can be reduced, and the occurrence of a flare can be reduced. Each component will be described in detail in the following paragraphs.

Referring to FIG. 1, in the present disclosure, the first bonding layer 20 can be formed on a bonding surface 11 of a light transmittable board 1B by a coating, printing or laminating process. The light transmittable board 1B allows light to penetrate therethrough. The material of the light transmittable board 1B can be, for example, glass or acrylic. However, the present disclosure is not limited thereto. A quantity of the first bonding layer 20 can be more than one. The first bonding layer 20 has an enclosed shape, such as a rectangular frame. However, the present disclosure is not limited thereto.

The first bonding layer 20 is made of an opaque material, such as silicone or an epoxy resin. However, the present disclosure is not limited thereto. The first bonding layer 20 can be formed on the bonding surface 11 of the light transmittable board 1B by a coating, printing, or laminating process. The first bonding layer 20 includes a first inner circumference 21 and a plurality of first protruded portions 22. The plurality of first protruded portions 22 protrude inwardly from the first inner circumference 21. In this embodiment, the first protruded portions 22 have a triangular shape. However, the present disclosure is not limited thereto.

Then, the second bonding layer 20*a* is disposed on the first bonding layer 20. The second bonding layer 20*a* is opposite to the light transmittable board 1B. The second bonding layer 20*a* is made of opaque material, such as silicone or an epoxy resin. However, the present disclosure is not limited thereto. The second bonding layer 20*a* is formed in an enclosed shape (e.g., a rectangular frame), but is not limited thereto. The second bonding layer 20*a* can be directly produced on the first bonding layer 20. Alternatively, the second bonding layer 20a can be independently produced, and is then attached to or assembled with the first bonding layer 20. The second bonding layer 20a includes a second inner circumference 21a and a plurality of second protruded portions 22a. The plurality of second protruded portions 22a protrude inwardly from the second inner circumference 21a. The plurality of second protruded portions 22a and the plurality of first protruded portions 22 are arranged in a staggered manner. The light transmittable board 1B is further sliced into a plurality of light transmittable members 10.

Figure 4:
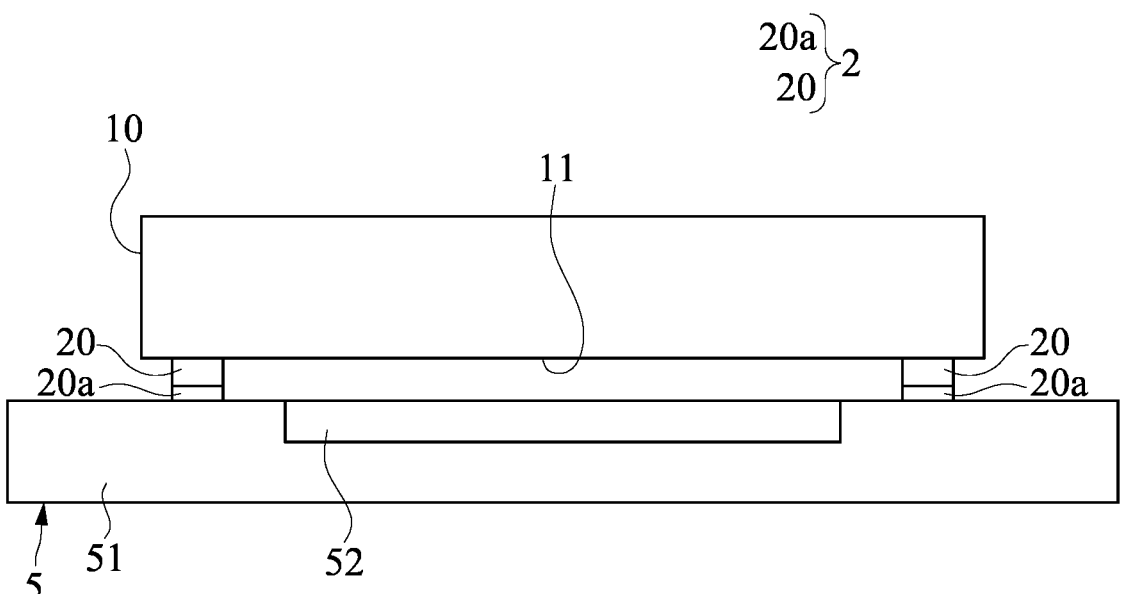
FIG. 4 is a schematic side view of an optical package structure according to the first embodiment of the present disclosure.

Referring to FIG. 4, in this embodiment, the optical element is exemplified as an image sensor. An image sensor 5 includes a substrate 51 and an image-sensing region 52 disposed on a top surface of the substrate 51. The image sensor 5 is connected to the second bonding layer 20a. The image sensor 5 and the light transmittable member 10 are spaced apart. The completed optical package structure includes the light transmittable member 10, the first bonding layer 20, the second bonding layer 20a, and the image sensor 5. The first bonding layer 20 is connected to the bonding surface 11 of the light transmittable member 10. The second bonding layer 20a is connected to the first bonding layer 20, and is opposite to the light transmittable member 10. Another side of the second bonding layer 20a is connected to the substrate 51 of the image sensor 5. In this embodiment, the optical package structure provides a complex undulate shape that is formed through the plurality of the first protruded portions 22 and the plurality of second protruded portions 22a. Therefore, light incident to the optical package structure can be scattered, thereby reducing the occurrence of flares.

Regarding the above-mentioned staggered structural arrangement, in this embodiment, intervals of the plurality of first protruded portions 22 (such as an interval between every two adjacent tips thereof) are equal to intervals of the plurality of second protruded portions 22a (such as an interval between every two adjacent tips thereof). For example, the interval can range between 1 µm and 1 mm. In addition, after the second bonding layer 20a is rotated by 180 degrees along a center line of any side, the second bonding layer 20a is identical with the first bonding layer 20. In other words, the second bonding layer 20a is the same as the first bonding layer 20 after being rotated left or right by 180 degrees along a vertical center line. Alternatively, the second bonding layer 20a is also the same as the first bonding layer 20 after being rotated up or down by 180 degrees along a horizontal center line. The advantage of the above arrangement is that the bonding layers can be made to have the same shape. In this way, one of the bonding layers is rotated and disposed on another bonding layer for formation of the bonding structural member 2.

Specifically, the first bonding layer 20 and the second bonding layer 20a have a plurality of inner surfaces that are identical in structure. In detail, each has four inner surfaces. For the first bonding layer 20, a quantity of the first protruded portions 22 is equal to a plurality of integers (N) plus one half (0.5) on each inner surface. For the second bonding layer 20a, a quantity of the second protruded portions 22a is equal to a plurality of integers (N) plus one half (0.5) on each inner surface. For example, referring to FIG. 1, the quantity of the first protruded portions 22 on a lower or an upper inner surface of the first bonding layer 20 is 12.5, and the quantity of the second protruded portions 22a on a lower or an upper inner surface of the second bonding layer 20a is also 12.5. The quantity of the first protruded portions 22 on a left or a right inner surface of the first bonding layer 20 is 9.5, and the quantity of the second protruded portions 22a on a left or a right inner surface of the second bonding layer 20a is also 9.5. On the same one of the inner surfaces (such as the upper inner surface), the first protruded portions 22 and the second protruded portions 22a have the same quantity, but are arranged in opposite directions. In other words, on the upper inner surface of the first bonding layer 20, the quantity of the first protruded portions 22 from left to right is a half (0.5) and N integer ones. On the corresponding upper inner surface of the second bonding layer 20a, the quantity of the second protruded portions 22a from left to right is N integer ones and a half (0.5).

Figure 5:
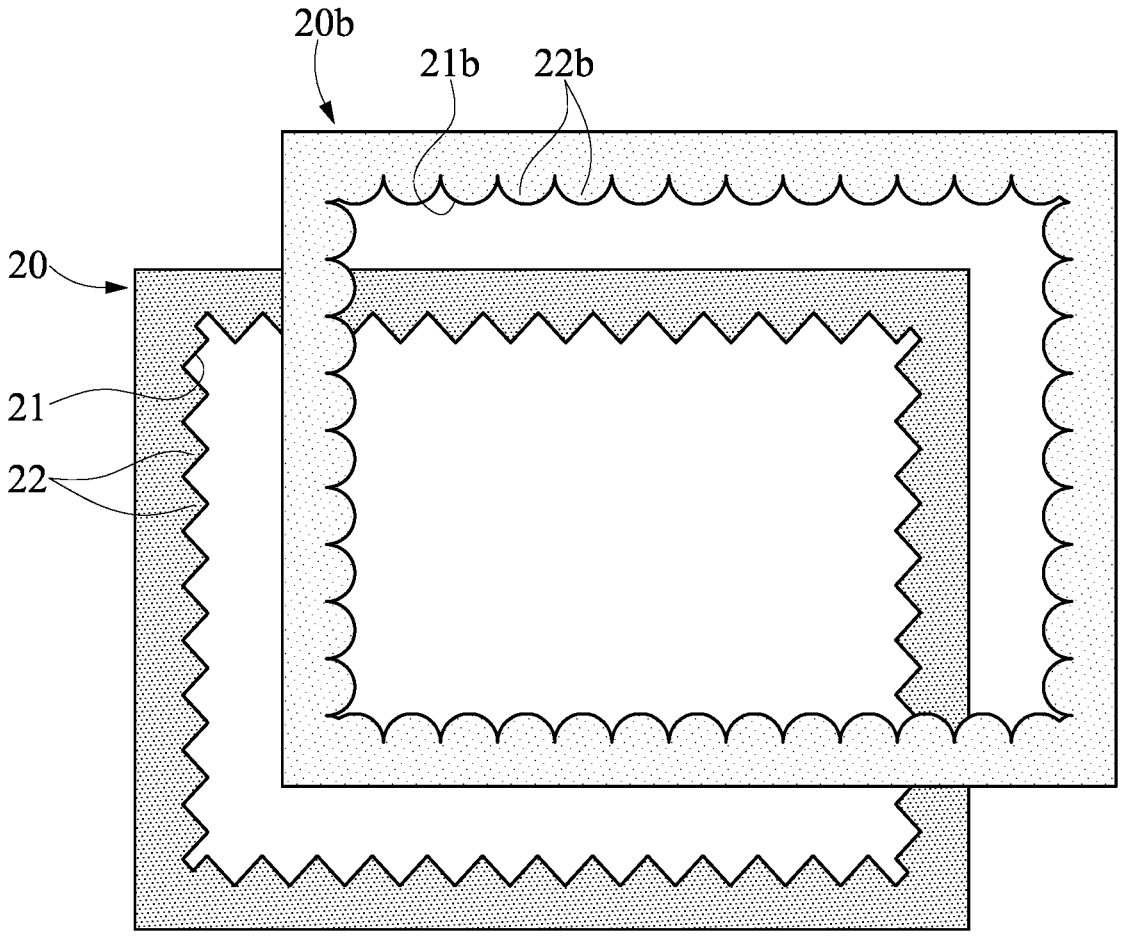
FIG. 5 is a schematic exploded view of another configuration of the bonding structural member according to the first embodiment of the present disclosure.

However, the present disclosure is not limited to the above-mentioned examples. Other configurations of the bonding structural member are exemplified as follows. Referring to FIG. 5, another configuration of the bonding structural member is illustrated. The shape of the first protruded portions 22 is different from that of second protruded portions 22b. The first protruded portions 22 are shaped to have an acute angle or to be triangular. On a second inner circumference 21b of a second bonding layer 20b, the second protruded portions 22b have an arc or a semi-circular shape. The intervals of the first protruded portions 22 and those of the second protruded portions 22b can be the same.

Figure 6:
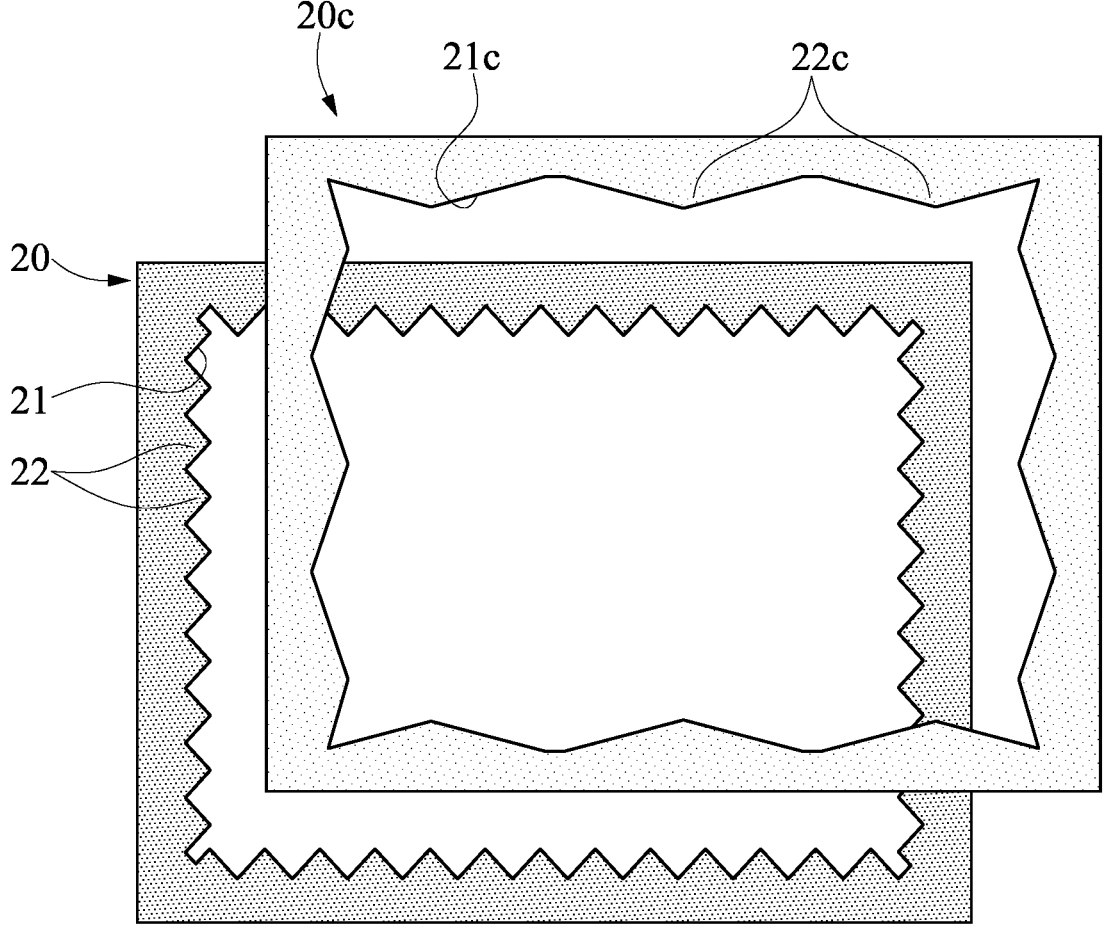
FIG. 6 is a schematic exploded view of yet another configuration of the bonding structural member according to the first embodiment of the present disclosure.

Referring to FIG. 6, yet another configuration of the bonding structural member is illustrated. Second protruded portions 22c of a second bonding layer 20c are shaped to have an obtuse angle on a second inner circumference 21c. The quantity of the first protruded portions 22 is more than that of the second protruded portions 22c.

Figure 7:
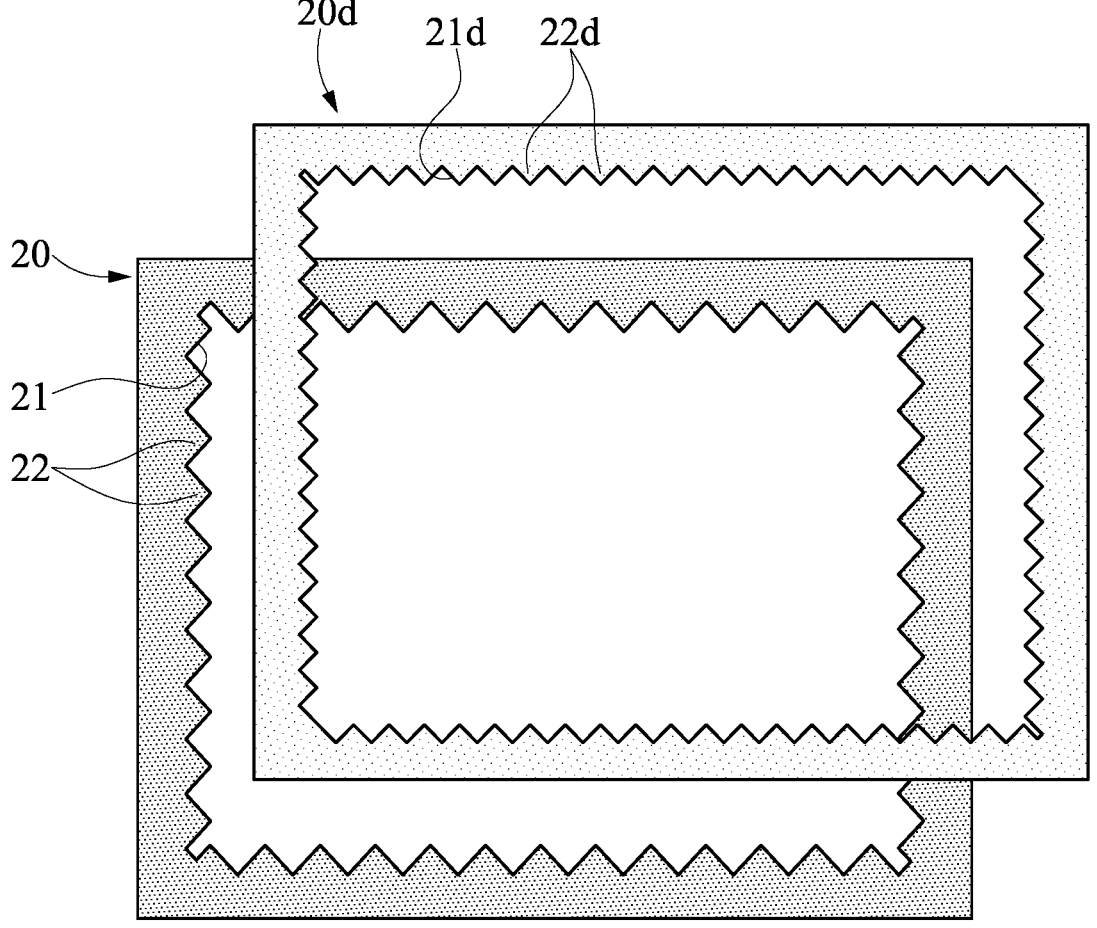
FIG. 7 is a schematic exploded view of still another configuration of the bonding structural member according to the first embodiment of the present disclosure.

Referring to FIG. 7, still another configuration of the bonding structural member is illustrated. A width of a second bonding layer 20d is smaller than that of the first bonding layer 21. A second inner circumference 21d has a plurality of second protruded portions 22d. The intervals of the first protruded portions 22 are larger than and different from those of the second protruded portions 22d. In other words, the first protruded portions 22 are large triangles, and the second protruded portions 22d are small triangles.

Second Embodiment

Figure 8:
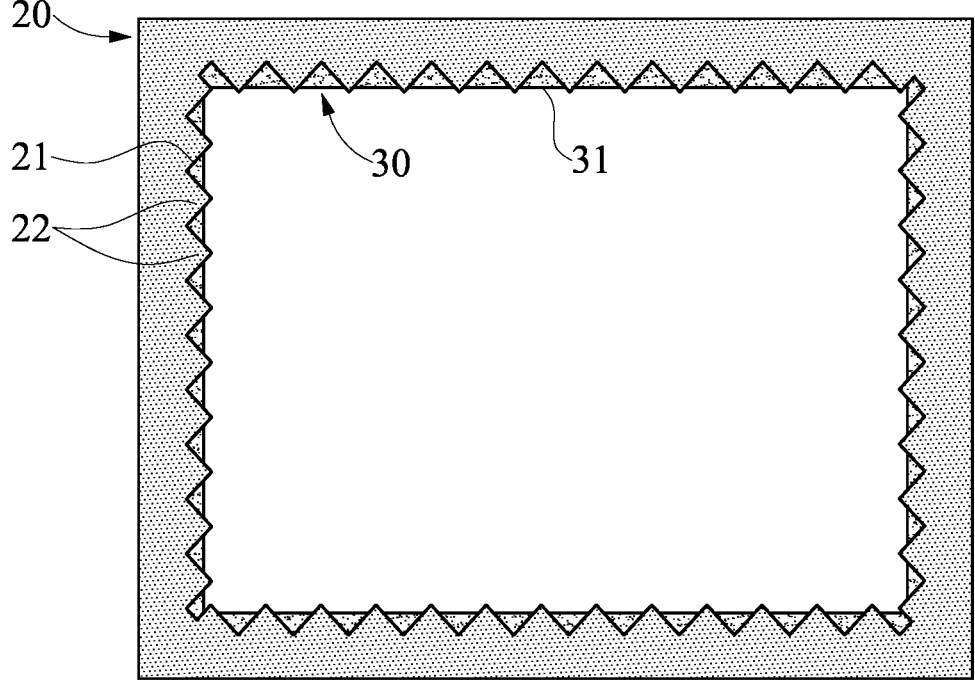
FIG. 8 is a schematic top view of a bonding structural member according to a second embodiment of the present disclosure.

Reference is made to FIG. 8, which is a schematic top view of a bonding structural member according to a second embodiment of the present disclosure. In this embodiment, the bonding structural member of the optical package structure can also provide a light-scattering effect. In addition, the light transmittable member 10 and the optical element are the same as those of the first embodiment, which will not be reiterated herein. Furthermore, the first bonding layer 20 can be the same as that of the first embodiment. The first bonding layer 20 has an enclosed shape, and is made of opaque material. The first bonding layer 20 includes a first inner circumference 21, a plurality of first protruded portions 22, and a plurality of first concave portions 23. Each of the first concave portions 23 is arranged between two adjacent ones of the first protruded portions 22.

Figure 10:
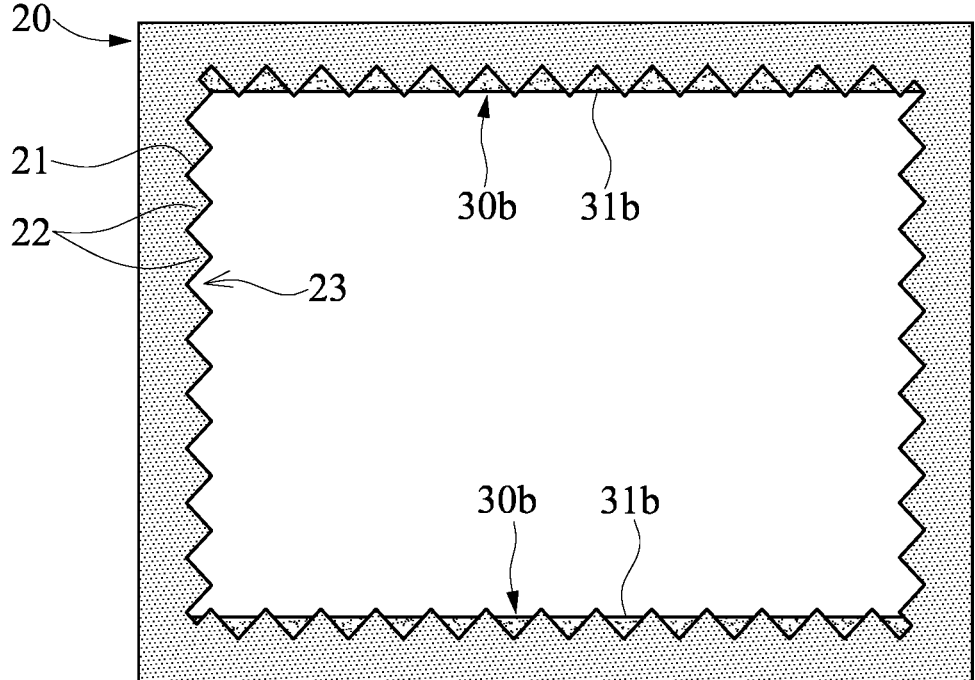
FIG. 10 is a schematic exploded view of yet another configuration of the bonding structural member according to the second embodiment of the present disclosure.
Figure 11:
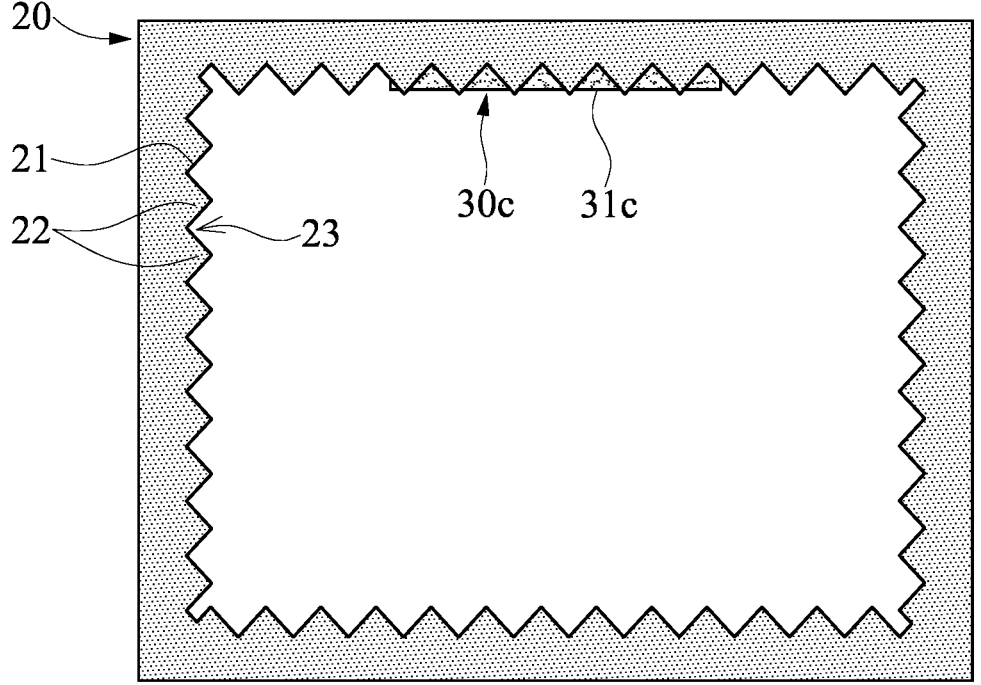
FIG. 11 is a schematic exploded view of still another configuration of the bonding structural member according to the second embodiment of the present disclosure.
Figure 12:
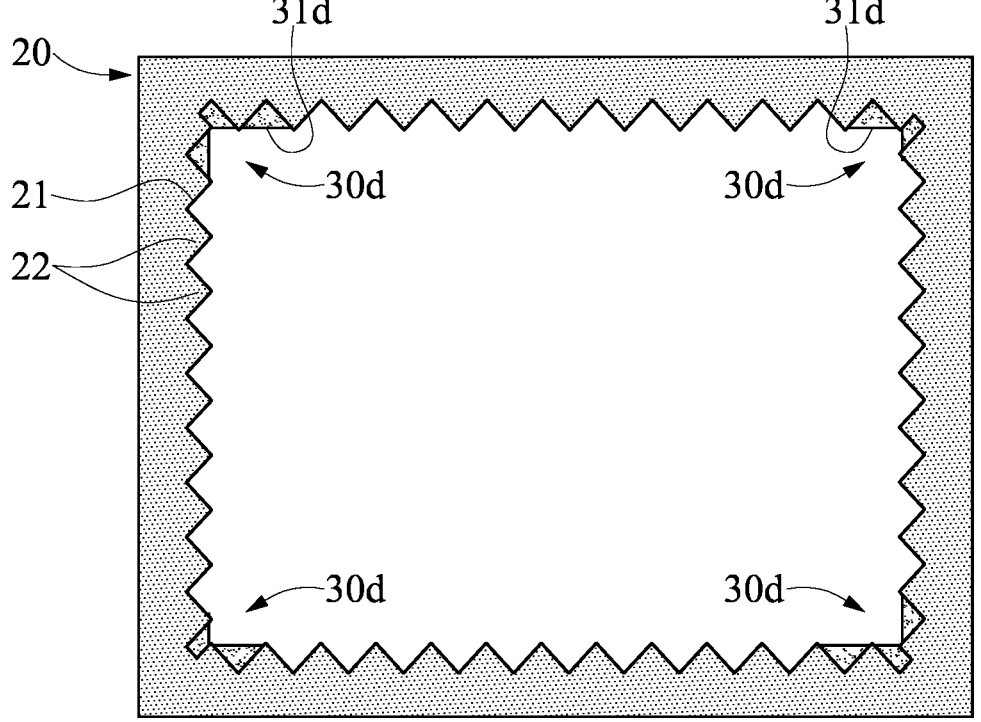
FIG. 12 is a schematic exploded view of still yet another configuration of the bonding structural member according to the second embodiment of the present disclosure.

The difference between the second embodiment and the first embodiment is that a second layer is formed on the first inner circumference 21 of the first bonding layer 20, and is made of a light absorbing material. Specifically, the second layer is a light-absorption member 30, which is coated on the first inner circumference 21 of the first bonding layer 20 and filled in all of the first concave portions 23. However, the present disclosure is not limited thereto. The light-absorption member 30 can also be filled in some of the first concave portions 23 as shown in FIG. 10 to FIG. 12. The light-absorption member 30 can be, for example, ink, epoxy resin, or photoresist material. Therefore, the light-absorption member 30 can absorb light emitted to inner sides of the bonding structural member, so as to prevent the light from being reflected to the image sensor 5 and reduce the occurrence of a flare.

Specifically, the light-absorption member 30 can be formed on the first inner circumference 21 of the first bonding layer 20 by a coating process.

As shown in FIG. 8, the interior of the first concave portions 23 is not fully filled by the light-absorption member 30, and a tip of each of the first protruded portions 22 is exposed to an inner surface 31 of the light-absorption member 30.

However, the present disclosure is not limited thereto. The bonding structural member of the second embodiment can have other configurations and are exemplified as follows.

Figure 9:
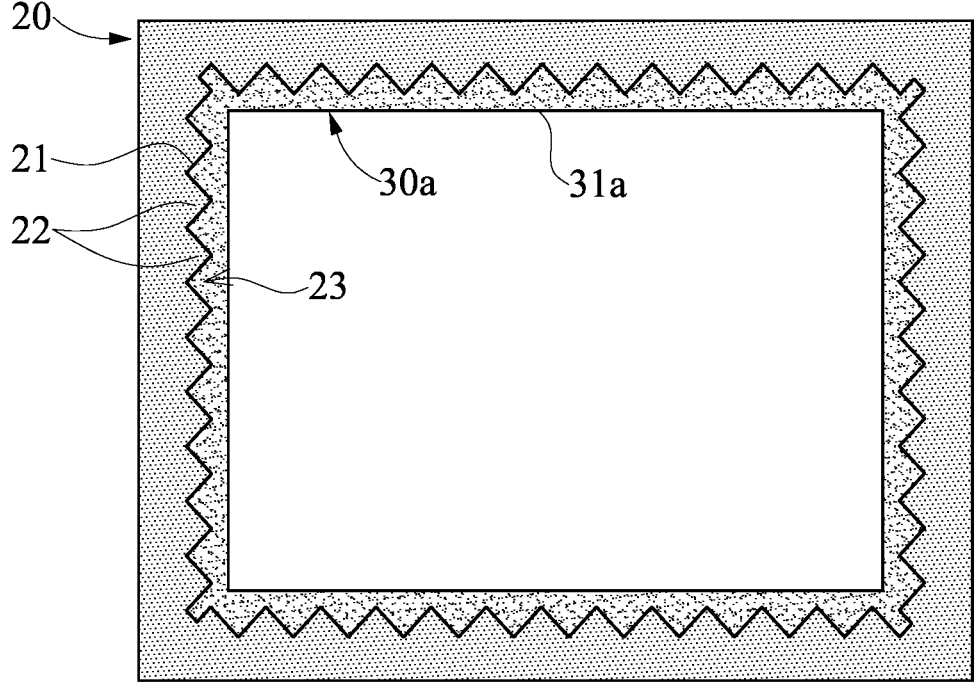
FIG. 9 is a schematic exploded view of another configuration of the bonding structural member according to the second embodiment of the present disclosure.

Another configuration is shown in FIG. 9, in which the interior of the first concave portions 23 is fully filled by a light-absorption member 30a. The tip of each of the first protruded portions 22 is fully covered by an inner surface 31a of the light-absorption member 30. The inner surface 31a of the light-absorption member can be flat.

Yet another configuration is shown in FIG. 10, in which a light-absorption member 30b is only filled in an upper portion and a lower portion of the first inner circumference 21 of the first bonding layer 20. The tip of each of the first protruded portions 22 slightly protrudes beyond an inner surface 31b of the light-absorption member 30.

Still another configuration is shown in FIG. 11, in which a light-absorption member 30c is only filled in the upper portion of the first inner circumference 21 of the first bonding layer 20. The tip of each of the first protruded portions 22 slightly protrudes beyond an inner surface 31c of the light-absorption member 30c.

Still yet another configuration is shown in FIG. 12, in which a light-absorption member 30d is only filled in the first protruded portions 22 at four corners of the first inner circumference 21 of the first bonding layer 20. An inner surface 31d of the light-absorption member 30d is flush with the tip of each of the first protruded portions 22.

Figure 13:
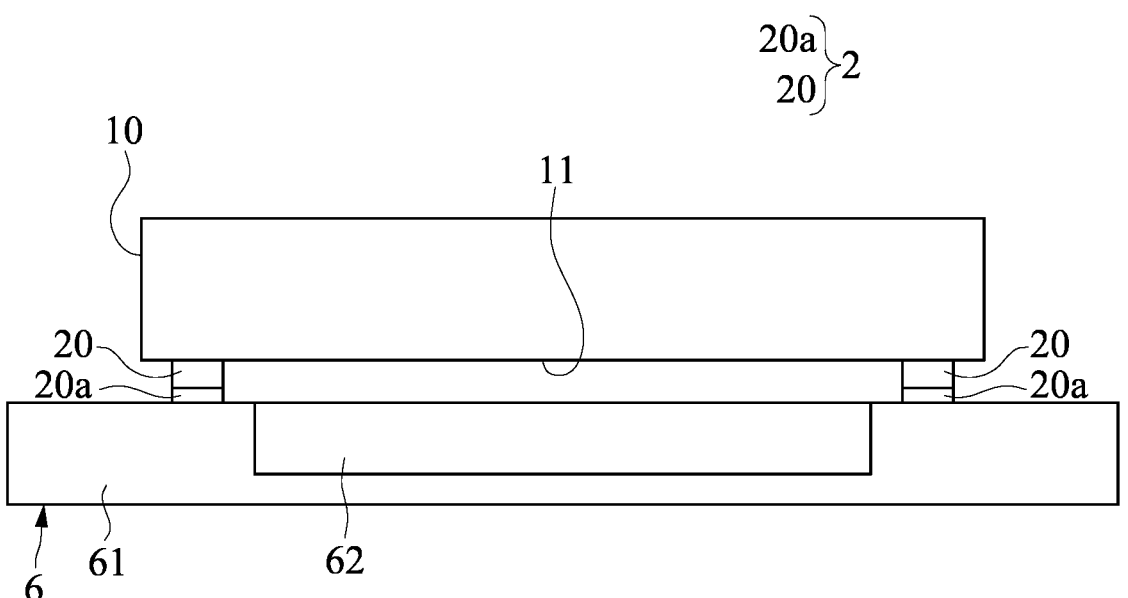
FIG. 13 is a schematic side view showing the optical package structure being applied to a display element according to the present disclosure.

Referring to FIG. 13, the optical package structure of the present disclosure can be applied to a display element 6. The difference between FIG. 13 and FIG. 4 is that the optical element is the display element 6, which includes a substrate 61 and a display emitting region 62 on a top surface of the substrate 61. The display element 6 and the light transmittable member 10 are spaced apart from each other. The first bonding layer 20 of the bonding structural member 2 is connected to the bonding surface 11 of the light transmittable member 10. Another side of the second bonding layer 20a is connected to the substrate 61 of the display element 6. Therefore, through the complex shape formed on the first protruded portions 22 and the second protruded portions 22a, the optical package structure of this embodiment can scatter the light reflected by the bonding structural member 2. As such, the light reflected into the human eye is reduced, and the occurrence of a flare is reduced. In addition, the light of the display emitting region 62 is less likely to be reflected or refracted by the non-display region, such as a package material or a bonding layer. It should be noted that, the bonding structural member of this embodiment can be various configurations as shown in FIG. 5 to FIG. 12.

Beneficial Effects of the Embodiments

In conclusion, one of beneficial effects of the present disclosure is that, in the optical package structure provided by the present disclosure, the first protruded portions of the first bonding layer and the second protruded portions of the second bonding layer are arranged in a staggered manner and form a protrusion structure, so that the light reflected to the optical function region of the optical package structure can be reduced, or the light from the optical function region is less likely to be refracted or reflected by the non-display region (such as a package material or a bonding layer). In this way, the occurrence of a flare is reduced. In another embodiment, the optical package structure of present disclosure includes the light-absorption member. The light-absorption member is disposed on the first inner circumference of the first bonding layer. The light-absorption member can absorb light, so that the light reflected to the optical function region of the optical package structure is reduced, or the light from the optical function region is less likely to be refracted or reflected by the non-display region (such as a package material or a bonding layer). Accordingly, the occurrence of a flare is reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An optical package structure, comprising:
a light transmittable member having a bonding surface;
a first bonding layer having an enclosed shape and connected to the bonding surface of the light transmittable member, wherein the first bonding layer is made of an opaque material, the first bonding layer includes a first inner circumference and a plurality of first protruded portions, and the plurality of first protruded portions protrude inwardly from the first inner circumference;
a second bonding layer having an enclosed shape, wherein the second bonding layer is opposite to the light transmittable member and connected to the first bonding layer, the second bonding layer is made of an opaque material, the second bonding layer includes a second inner circumference and a plurality of second protruded portions, and the plurality of second protruded portions protrude inwardly from the second inner circumference;
wherein the plurality of second protruded portions and the plurality of first protruded portions are arranged in a staggered manner; and
an optical element connected to the second bonding layer, wherein the optical element and the light transmittable member are spaced apart from each other.

2. The optical package structure according to claim 1, wherein an interval between any two adjacent ones of the plurality of first protruded portions is equal to an interval between any two adjacent ones of the plurality of second protruded portions, and the second bonding layer has four sides;

wherein, after the second bonding layer is rotated by 180 degrees along a center line of any one of the four sides, the second bonding layer is identical with the first bonding layer.

3. The optical package structure according to claim 2, wherein the interval between any two adjacent ones of the plurality of first protruded portions, and the interval between any two adjacent ones of the plurality of second protruded portions each range between 1 μm and 1 mm.

4. The optical package structure according to claim 2, wherein the first bonding layer and the second bonding layer each have a plurality of inner surfaces, a quantity of the plurality of inner surfaces of the first bonding layer is the same as a quantity of the plurality of inner surfaces of the second bonding layer, a quantity of the plurality of first protruded portions on each of the inner surfaces is equal to a plurality of integers plus one half, a quantity of the plurality of second protruded portions on each of the inner surfaces is equal to a plurality of integers plus one half; wherein the plurality of first protruded portions and the plurality of second protruded portions on a corresponding one of the inner surfaces have a same quantity, but are arranged in opposite directions; wherein, on the corresponding one of the inner surfaces, the plurality of first protruded portions are so arranged that the one half is followed by the plurality of integers, and the plurality of second protruded portions are so arranged that the plurality of integers are followed by the one half.

5. The optical package structure according to claim 1, wherein an interval between any two adjacent ones of the plurality of first protruded portions is different from an interval between any two adjacent ones of the plurality of second protruded portions.

6. The optical package structure according to claim 1, wherein a shape of the plurality of first protruded portions is different from a shape of the plurality of second protruded portions.

7. The optical package structure according to claim 1, wherein the optical element is an image sensor, the image sensor includes a substrate and an image-sensing region disposed on a top surface of the substrate, and the image sensor and the light transmittable member are spaced apart from each other; wherein the first bonding layer is connected to the light transmittable member, and another side of the second bonding layer is connected to the substrate of the image sensor.

8. The optical package structure according to claim 1, wherein the optical element is a display element, the display element includes a substrate and a display emitting region disposed on a top surface of the substrate, and the display element and the light transmittable member are spaced apart from each other; wherein the first bonding layer is connected to the light transmittable member, and another side of the second bonding layer is connected to the substrate of the display element.

9. An optical package structure, comprising:
a light transmittable member having a bonding surface;
a first bonding layer having an enclosed shape and connected to the bonding surface of the light transmittable member, wherein the first bonding layer is made of an opaque material, the first bonding layer includes a first inner circumference, a plurality of first protruded portions, and a plurality of first concave portions, the plurality of first protruded portions protrude inwardly from the first inner circumference, and each of the plurality of first concave portions is arranged between two adjacent ones of the plurality of first protruded portions;
a light-absorption member disposed on the first inner circumference of the first bonding layer, wherein the light-absorption member is filled in some or all of the plurality of first concave portions; and
an optical element connected to the first bonding layer, wherein the optical element and the light transmittable member are spaced apart from each other.

10. The optical package structure according to claim 9, wherein the light-absorption member is coated on the first inner circumference of the first bonding layer, and the light-absorption member is ink, an epoxy resin, or a photoresist material.

11. The optical package structure according to claim 9, wherein at least one of the plurality of first concave portions is not filled by the light-absorption member, and a tip of each of the plurality of first protruded portions is exposed to the light-absorption member.

12. The optical package structure according to claim 9, wherein at least one of the plurality of first concave portions is filled by the light-absorption member, and a tip of each of the plurality of first protruded portions is covered by the light-absorption member.

13. The optical package structure according to claim 9, wherein an inner surface of the light-absorption member is flat.

14. The optical package structure according to claim 9, wherein the optical element is an image sensor, the image sensor includes a substrate and an image-sensing region disposed on a top surface of the substrate, and the image sensor and the light transmittable member are spaced apart from each other; wherein the first bonding layer is connected between the light transmittable member and the substrate of the image sensor.

15. The optical package structure according to claim 9, wherein the optical element is a display element, the display element includes a substrate and a display emitting region disposed on a top surface of the substrate, and the display element and the light transmittable member are spaced apart from each other; wherein the first bonding layer is connected between the light transmittable member and the substrate of the display element.

* * * * *